United States Patent [19]

Bancroft et al.

[11] Patent Number: 4,523,071

[45] Date of Patent: Jun. 11, 1985

[54] METHOD AND APPARATUS FOR FORMING A BALL AT THE END OF A WIRE

[75] Inventors: Charles F. Bancroft, Sherman Oaks; Thomas B. Brown; Peter W. Bullock, both of Vista; Leroy V. Sutter, Jr., Culver City, all of Calif.

[73] Assignee: Hughes Aircraft Company, Culver City, Calif.

[21] Appl. No.: 610,158

[22] Filed: May 14, 1984

[51] Int. Cl.³ .................................. B23K 9/06
[52] U.S. Cl. ........................ 219/56.22; 219/56.21; 219/130.4
[58] Field of Search ............... 219/56.21, 56.22, 130.4

[56] References Cited

U.S. PATENT DOCUMENTS 2,708,719 5/1955 Roach ............................ 219/130.4
2,784,349 3/1957 Anderson ...................... 219/130.4
3,767,101 10/1973 Genrich ................................ 228/1
4,459,452 7/1984 Carter .............................. 219/56.22

FOREIGN PATENT DOCUMENTS 1536872 12/1978 United Kingdom .
1600021 10/1981 United Kingdom .

OTHER PUBLICATIONS

A. Bischoff and F. Aldinger, "Ball Bonding of Nonprecious Metal Wires", Semiconductor International, Aug. 1982, pp. 65-80.

Primary Examiner—Clifford C. Shaw
Attorney, Agent, or Firm—Joseph E. Szabo; William J. Bethurum; Anthony W. Karambelas

[57] ABSTRACT

A ball is formed at the tip of a wire by an arc. The arc is initiated and maintained across an air gap between the wire tip and an electrode by applying timed RF and DC voltages between them.

32 Claims, 2 Drawing Figures

METHOD AND APPARATUS FOR FORMING A BALL AT THE END OF A WIRE

BACKGROUND OF THE INVENTION

1. Field of the Invention

The present invention relates generally to the field of joining the tip of a wire to another surface and, more particularly, to forming a ball at the tip of such a wire preparatory to such a joinder.

2. Description of the Prior Art

In the fabrication of electronic circuits incorporating integrated circuit chips, many secure electrical connections must be made to individual conducting pads on the integrated circuit so as to provide the means to interconnect its myriad circuits with other components. Ball bonding is a technique which has gained widespread acceptance in the electronics industry for effecting such interconnections. U.S. Pat. No. 3,767,101, issued to W. D. Genrich, and assigned to the present assignee, describes this technique and a bonder suitable to perform it. As described in that patent, a wire is fed through the tip of a capillary until it protrudes slightly beyond its end. A flame applied to the wire near the capillary tip terminates the wire at that point and causes it to form a small ball. The capillary is then moved against the conducting pad to which the wire is to be bonded until the ball-tipped wire makes contact therewith. By the combined application of pressure, heat and vibration, a bond is created between the conducting pad and the ball at the tip of the wire. The capillary is then withdrawn, allowing wire to be pulled from it to form a lead tailing from the bonded tip of the wire. The wire may then be terminated to form a free lead, or may be bonded to a second point on the circuit in a manner which is not relevant here.

Gold is the metal of choice in such a bonding arrangement because it does not oxidize when the ball is formed on the wire being heated. Considerable research has been directed to discover ways in which non-precious metal wires can be successfully substituted for gold. Some of these efforts are described in "Ball Bonding Of Nonprecious Metal Wires" in the August 1982 issue of *Semiconductor International* at pages 65 et seq. According to the article, it is impossible to form a ball at the end of an aluminum alloy wire by flaming off in air. Not only is ball formation difficult under those circumstances, but a subsequent bonding operation is made impossible according to the article by the formation of thick oxide layers on the surface of the ball. The article despribes as a possible solution the performance of the flaming off operation by performing the ball formation in an inert gas, such as argon.

Another approach to forming a ball at the tip of a wire preparatory to ball bonding appears in British Pat. Nos. 1,536,872 and 1,600,021. Both of these patents address the goal of forming a ball at the tip of an aluminum wire and propose to do so by. means of a spark discharge. In Pat. No. 1,536,872 the spark discharge is initiated by applying a voltage of about 200 volts across a gap between the wire end and an electrode, and bringing the tip of the wire and the electrode into temporary contact, fusing the wire's tip and forming the spark discharge while feeding a shielding gas to the region of the spark discharge. A similar technique for forming a ball at the tip of an aluminum wire is described in Pat. No. 1,600,021, with the spark discharge, however, being initiated across the gap in a shielding atmosphere. This apparently was thought to be made possible by the use of a voltage between 350 volts and 10,000 volts.

From the above it is apparent that previous approaches to the formation of a ball at the tip of an aluminum or other base metal wire were limited to the use of an inert atmosphere in order to prevent the formation of an oxide layer on the ball which would prevent subsequent bonding, and that the use of such an inert gas atmosphere was deemed necessary both where the ball was formed by flaming off and by spark discharge. To the best of our knowledge this approach has not produced balls of consistent shape and size, sufficiently free of oxides to allow reproducible bonding results, because the turbulence created by the moving bonder mechanism does not allow an inert gas envelope of consistent density to be maintained in the immediate area of the flame-off or spark discharge.

It is a principal object of the present invention to form a substantially oxide-free ball at the tip of a wire by a method which results in consistent ball size, which is equally effective whether the wire be precious metal or base metal, and which does not necessitate the use of an inert gas atmosphere.

A related object of the invention is to provide apparatus capable of developing and applying the necessary potentials and currents to form, in air, a ball of consistent and controllable size at the end of a wire even though the wire is of a base metal.

SUMMARY OF THE INVENTION

In keeping with the above object of the present invention, a ball is formed at the tip of a wire preparatory to its being joined to another surface by first initiating an electric arc to the wire's tip by subjecting it to an RF electric field after a DC voltage is applied and maintaining that arc after the DC is removed by subjecting the wire tip to an RF electric field. Advantageously, the wire tip is subjected to the DC electric field prior to, during and after the initiation of the electric arc by the RF electric field. Establishment of the DC electric field prior to initiation of the electric arc serves to establish conditions which are conducive to initiation of the arc by the RF field. Maintaining the DC electric field after initiation of the electric arc serves to create a ball of the desired size.

The present invention also contemplates the provision of apparatus for implementing the above-described method by the provision of means whereby the wire may be supported adjacent to the surface to which it is to be joined, an electrode supported next to the tip of the wire and means for generating and applying across the gap between the wire tip and the electrode an RF voltage sufficient to initiate and maintain an arc across the gap and the DC voltage necessary to form the ball at the end of the wire. In keeping with this aspect of the invention, a tuned circuit is provided to apply the outputs of both the RF and the DC voltage sources across the gap between the wire and the electrode, with the tuned circuit being resonant at the frequency of the RF voltage so as to step up the RF voltage from a relatively low level at which it is generated to a significantly higher level at which it is applied across the gap. The RF voltage also serves to maintain a plasma across the gap after termination of the DC voltage, a phenomenon which retards oxide formation on the ball.

With the use of the above-described method, particularly when implemented by the above-described apparatus, it has been found possible to consistently form balls of uniform size at the tip of a wire in air. Metals which have been successfully used include copper, nickel, aluminum and brass.

Other objects and features of the invention will become apparent from the following detailed description with reference to the following drawings.

DETAILED DESCRIPTION OF THE INVENTION

Figure 1:
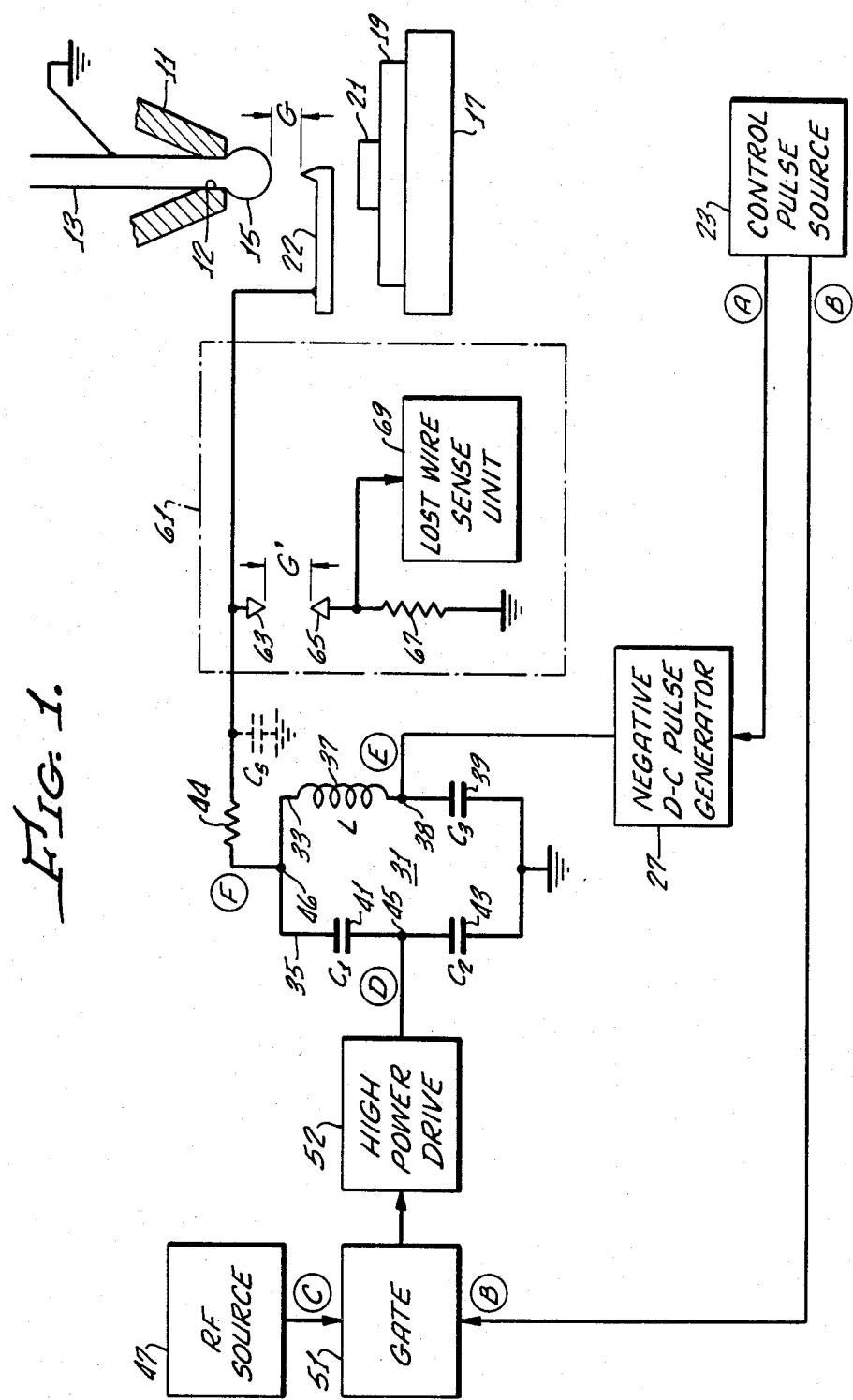
FIG. 1 is a block-schematic diagram of a system for forming a ball at the end of a wire in accordance with the present invention.

An apparatus suitable for implementing our improved method is disclosed in FIG. 1. It includes a conventional capillary 11 having an orifice 12 in its tip through which a wire 13 is fed. By means to be described, a ball 15 is formed in accordance with the invention at the tip of the wire 13. This ball, which in the past was formed by flaming off or by spark discharge, is normally pressed by means of the capillary 11 against a conductive metal pad 21 which is one of many such pads on an integrated circuit 19 supported on a positioning table 17. Successive bonds may be made by moving a succession of the conductive pads 21 by translation of the table 17 coordinated with the lowering of the capillary 11 in a manner well known in the art. Spaced from the tip of the capillary 11 is an electrode 22 which is positioned (by conventional means not shown) between the capillary 11 and the conductive metal pad 21 during formation of the ball 15 and is swung out of position to allow the capillary 11 to be lowered so as to press the ball 15 against the conductive metal pad 21 during the actual bonding step.

Figure 2:
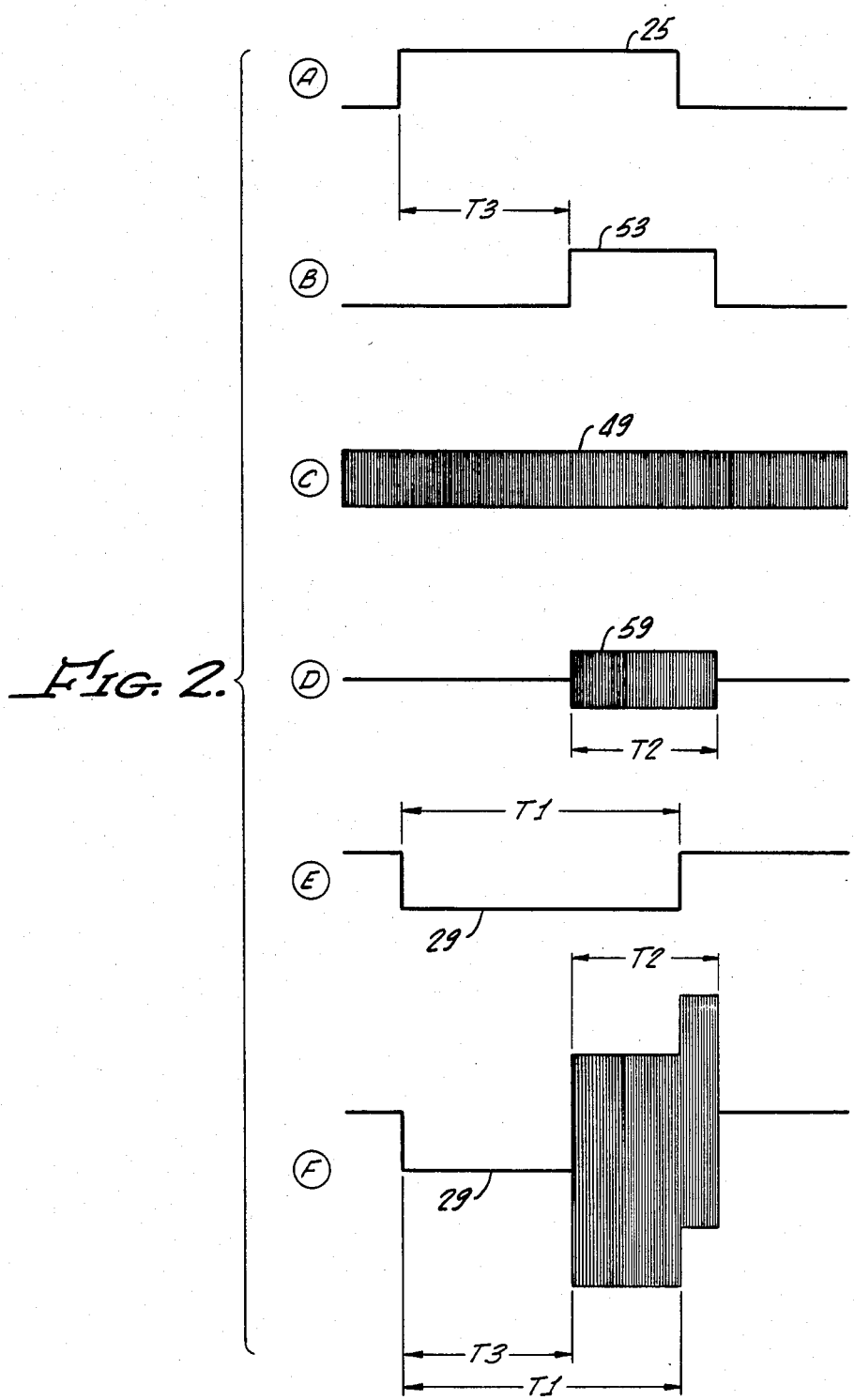
FIG. 2 is a series of timing diagrams illustrating the voltages used to initiate and maintain an arc between the tip of a wire and an electrode of the apparatus disclosed in FIG. 1.

The first step in the process of forming the ball 15 is to apply a DC voltage across the gap between the ball 15 and an electrode 22 so as to enhance conditions for the initiation of the arc across the gap which is to follow shortly. Toward this end, a control pulse 25 is generated by a control pulse source 23 and applied to a negative DC pulse generator 27 whose output 29 is applied to the input node 38 of a tuned circuit 31. The tuned circuit 31 comprises a pair of branches 33 and 35 wherein the branch 33 includes an inductor 37 connected in series with a capacitor 39, and the branch 35 comprises a capacitor 41 connected in series with a capacitor 43. One end of the tuned circuit 31 is connected to ground, as is the wire 13. The other end of the tuned circuit 31, output node 46, is connected to the electrode 22 through a DC current limiting resistor 44. Thus, the DC pulse 29 appears across the gap G during the time period T1 as indicated in FIG. 2.

During the period T1 the spark across the gap G is initiated by applying an RF pulse 59 across the gap G. The RF pulse 59 is derived in the exemplary embodiment illustrated in FIG. 1 from an RF source 47 whose output 49 is applied through a gate 51 to an RF power driver 52 under the control of a gating pulse 53 produced by the control pulse source 23. The resulting RF pulse 59 at the output of the RF power driver 52 is applied to the RF input node 45 of the tuned circuit 31. The tuned circuit 31 is designed to be resonant to the frequency of the RF pulse 59 so as to optimize the output which appears between ground and the RF output node 46. In the disclosed arrangement, the tuned circuit 31 serves to elevate the voltage of the RF pulse 59 which is applied at the RF input node 45 to a much higher level at the RF output node 46. This is accomplished by selecting the value of the capacitors 41 and 43 so as to make the reactive impedance of the capacitor 41 a substantial multiple of the reactive impedance of the capacitor 43. Since reactive impedance across a capacitor is inversely proportional to its size, the above selection requires that the capacitance of the capacitor 43 be a multiple of the capacitance of the capacitor 41. For reasons which will be explained shortly, the reactive impedance of the inductor 37 greatly exceeds that of the capacitor 39, so that the effect of the latter upon the tuned circuit's voltage multiplication function is negligible.

In forming a ball at the tip of the wire there will be a number of variables whose optimum value depends on various circumstances. Therefore, it is not possible to give a particular set of values which will yield the best results in all cases. Instead these variables will be noted, their relationship will be explained, and the manner in which their values should be selected will be set forth. In implementing the invention, energy is delivered in the gap G so as to melt the tip of the wire 13 and form a ball 15 thereon. The amount of energy that needs to be delivered will be a function of the material and diameter of the wire 13, as well as the size of the ball 15 to be formed thereon. The energy which is delivered, in turn, will be a function of the duration and magnitude of the current pulse which is delivered in the gap G. Results to date indicate a preferable gap size of 30 mils, with a useful range of between 20 and 40 mils. Wires which have been used have ranged between 0.0007 and 0.002 inches in diameter.

Thus, the magnitude and duration T1 of the DC pulse 29 are principally a function of the amount of energy that is to be delivered in the gap G. The total time period T1 is set by the negative DC pulse generator 27 which is operative to produce the DC pulse 29 for the time period T1 in response to a triggering pulse from the control pulse source 23. Time period T3 represents the delay between the leading edges of the timing pulse 25 and of the RF pulse 59, set by means of the control pulse source 23. The RF pulse 59 corresponds in duration with the gating pulse 53, and the DC pulse 29 corresponds in timing with the duration of the control pulse 25. The time period T3 is selected to provide enough time for the DC voltage 29 applied to DC input node 38 to rise substantially to its full value by the time the RF pulse 59 begins. The time period T2, during which the RF pulse 59 is maintained, is similarly designed to be long enough to insure that the RF pulse 59 will rise to the level at which it is sufficient to initiate an arc in the gap G before the end of the time period T2 and long enough to overlap the end of the DC voltage. In this way the circuit designer can assure that, by the end of the time period T2 the RF voltage 59 will have risen beyond the minimum voltage value required to initiate an arc in the gap G and provide a covering plasma after the DC voltage is removed. The maximum desirable time for T2 is determined by the need to avoid excessive annealing of the wire 13 where it necks into the ball 15, a condition which could weaken the wire sufficiently to reduce its strength below that of the bond, and which might occur if the RF pulse 59 were of excessive length. Finally, the time period T2 is selected so that it is sufficiently long to provide a low energy plasma arc to prevent excessive oxide formation on the ball. For a wire of a given material and diameter, ball size can be adjusted by varying either the amplitude (controllable by selecting the proper value for resistor 44) or the duration of the DC pulse, or both.

It should be understood that the waveforms illustrated in FIG. 2 are idealized and that they do not rise or fall instantaneously as illustrated. Thus, both the DC voltage 29 and the RF voltage 59 rise gradually to their ultimate levels, rather than instantaneously as shown. This is why sufficient time must be allowed for them to reach these levels. It should also be understood that the formation of the ball 15 begins as soon as the arc is initiated, which occurs sometime during the period T2, the precise time depending upon the instant when the RF voltage has reached the level at which the arc is initiated. Once the arc is formed, the RF voltage will level off at the value where the arc was initiated and will stay at that value until the end of the time period T2.

The circuit values which determine the magnitude and duration of the RF pulse 59 may be derived through a series of design steps. It should be understood that these design steps are relevant only where the particular apparatus illustrated in FIG. 1 is utilized. Needless to say, other circuits may be designed to create the sequence of voltages illustrated in FIG. 2 which constitute the essence of the method aspect of the present invention. Assuming, however, that the preferred circuit of FIG. 1 is used, an initial step in selecting these values is to determine the value of the stray capacitance $C_S$ introduced by the lead wire which connects the tuned circuit 31 to the electrode 22. Once the value of $C_S$ is determined, the capacitance C1 of the capacitor 41 will be selected to be sufficiently large relative to the stray capacitance value $C_S$ to render the effect of the latter minimal in the operation of the circuit. Next, the capacitance C2 of the capacitor 43 is selected so as to be a multiple of the capacitance C1 so as to cause the voltage appearing between the output node 46 and ground to be a multiple of the voltage applied between ground and the RF input node 45 to the tuned circuit 31. Since it is desired to have the inductor 37 appear to be connected in parallel across the capacitors 41 and 43 at the frequency of the RF pulse 59, the capacitance C3 of the capacitor 39 which is in series with the coil 37 is selected so as to make the reactive impedance of that capacitor a small fraction of the reactive impedance of the inductor. Completing the design of the tuned circuit 31, the inductance L of the inductor 37 is selected so that the resonant frequency of the circuit determined by the capacitance C1 and the inductance L will be in the vicinity of the frequency at which the RF source 47 is to operate. In selecting the inductor 37, its $Q_L$ also needs to be considered. The $Q_L$ of the inductor is a circuit characteristic of that component, and if it is sufficiently large will determine the $Q_{in}$ of the tuned circuit 31. The desired $Q_{in}$ of the tuned circuit 31, in turn, will be a function of the minimum input impedance Z between ground and the input node 45, expressed by $Z = Q_{in} \times X_{C2}$.

The minimum desirable $Q_{in}$ at 1.5 MHz was found to be on the order of 10, a value which is readily attainable, since inductors with a Q of about 100 are commercially available.

In implementing the system of FIG. 1 it is desirable that the circuit 31 be tuned to resonate at the frequency of the RF pulse 59. This could be accomplished by making the capacitor 41 or the inductor L a variable component so as to adjust the resonant frequency of the circuit 31 to that of the RF pulse 51. It is preferable, however, to keep the components 41 and 37 fixed and to make the frequency of the RF pulse variable instead. This is simply because it is much easier to make the RF source 47 variable in frequency than it is to make the capacitor 41 or the inductor 37 variable in size. Toward this end the RF source 47 in the preferred embodiment was formed of a fixed frequency oscillator operating at a frequency of 60 MHz working into a programmable frequency divider constructed in accordance with Motorola Application Note AN-584, entitled "Programmable Counters Using the MC 10136 and MC 10137 MECL 10,000 Universal Counters". FIG. 9 on page 5 of that Application Note shows the circuit suitable for creating the programmable frequency divider. A 12-position switch was used to configure the frequency divider so as to give a choice of any one of twelve frequencies ranging from 1.395 to 1.875 MHz. That is, the frequency division factor of the programmable frequency divider was changed by means of the 12-position switch so as to convert the 60 MHz input frequenc.y derived from the fixed frequency oscillator 47 to any one of twelve values within the range of 1.395 to 1.875 MHz. With such a variable RF frequency range, the tuned circuit 31 can be designed to be resonant at a point within a relatively wide range so that minor variations in the resonant frequency of the circuit 31 due to a change in the stray capacitance $C_S$ can be readily accommodated by use of the frequency selector switch.

An optional feature of the apparatus illustrated in FIG. 1 is a circuit 61 for diverting an arc which might be struck between the electrode 22 and either the wire 13 or the capillary 11 in the event that, through machine malfunction, the wire 13 failed to protrude beyond the tip of the capillary 11 preparatory to application of the arc-inducing potentials between the electrode 22 and the wire 13. The circuit which is to be described presently is not the invention of the present inventors, but rather is the invention of Roger F. Cressey, by whom a patent application will be filed thereon and will be assigned to the present assignee. The invention is described herein because it is believed to enhance the operation of the apparatus which is the subject of the present application. The circuit 61 comprises a pair of auxiliary electrodes 63 and 65, with the electrode 63 being connected to the electrode 22, and the electrode 65 being connected to ground through a resistor 67. The separation G' between the electrodes 63 and 65 relative to the separation G which exists between the electrode 22 and the tip of the wire 13 when the latter extends properly beyond the tip of the capillary is selected so that when the tip of the wire 13 projects properly beyond the tip of the capillary 11, the potential which is applied across both of the gaps G and G' will create an arc only across the gap G. Conversely, the gap separating the tip of the capillary 11 and the tip of the electrode 22, relative to the auxiliary gap G' is selected so that if the wire 13 should become arrested inside, and fail to protrude beyond, the tip of the capillary 11, the operating potentials applied across the gaps G and G' would result in the striking of an arc only across the auxiliary gap G'. In this way damage to the capillary, which might otherwise occur, is prevented. Such a condition can be readily detected by means of the circuit 61 by the provision of a sensing unit 69 connected so as to detect the potential which is generated across the resistor 67 only when an arc is struck across the electrodes 63 and 65, signifying failure of the wire 13 to protrude beyond the tip of the capillary 11.

If the geometries of the auxiliary electrodes 63 and 65 were similar to those of the electrode 22 and the tip of the wire 13 prior to it being formed into the ball 15, the auxiliary gap G' would be set to be intermediate in size between the gap G and the space between the capillary's tip and electrode 22.

In fact, because of the sharp edges presented by the tip of the wire 13 prior to arcing, and because the electrodes 63 and 65 may be flat-tipped rather than pointed, the auxiliary gap G' may have to be chosen to be somewhat smaller than the gap G to achieve the desired effect.

When an arc is properly struck across the gap G in forming a ball 15, its magnitude and duration will be a function not only of the potentials which are applied across the gap, but also of the circuit impedance through which the arc must flow in the form of a current. This circuit impedance is made up principally of the gap, the DC current limiting resistor 44, and the series resonant circuit comprising the capacitor 41 and the inductor 37. The latter two components can be considered to be connected essentially to ground at the RF frequency because the capacitor 39 has a sufficiently large value to represent a direct connection from the inductor 37 to ground and because the capacitor 43 can be considered effectively to be shunted to ground through the output impedance of the high power driver 52, typically on the order of 25 ohms. The series resonant circuit formed by the capacitor 41 and the inductor 37 serves to smooth the arc-current which might otherwise fluctuate excessively due to variations in the impedance across the gap G. The latter impedance will be on the order of 100 ohms, whereas the output impedance of the series resonant circuit comprising the capacitor 41 and the inductor 37 will be on the order of 30 kilo-ohms, this assuming a frequency of 1.5 MHz and a circuit Q of 30.

Thus, it may be seen that the size of the current represented by the arc across the gap G will be predominantly determined by the output impedance of the series resonant circuit and will be influenced only slightly by variations in the gap impedance.

Furthermore, since the arc resonates at the tuned frequency of the series resonant circuit, even after the DC pulse 29 has terminated, oxide formation on the ball 15 is significantly reduced, thus helping make the process operational without the use of an inert gas in the gap G or around the wire.

The following values and measurements represent one successful implementation of the method and apparatus in accordance with the present invention:

| | |
|---|---|
| inductor 37 | L = 75 ™ H at 1.8 MHz |
| | $Q_L$ = 150 at 1.8 MHz |
| capacitor 39 | 2000 picofarads |
| capacitor 41 | 100 picofarads |
| capacitor 43 | 3000 picofarads |
| resistor 44 | 150 ohms |
| wire material | aluminum |
| wire diameter | .0012 in. |
| wire ball diameter | .003 in. (approx.) |
| DC output voltage (29) | 550 volts |
| DC (arc) output current | 3.5 amps |
| RF driver output (59) | 350 volts |
| Gap G | .030 in. |
| Gap G' | .040 in. |
| T1 | 230 μsec |
| T2 | 150 μsec |
| T3 | 150 μsec |

Thus, there has been brought to the art of ball bonding a method, and the apparatus for its execution, whereby a ball can be formed at the end of a wire, whether it be of base or precious metal. The method yields balls which are substantially oxide-free and controllable in size without requiring the use of an inert gas to shield the ball during its formation.

What is claimed is:

1. A method of forming a ball at the tip of a wire preparatory to joining said wire tip to another surface, comprising the steps of:
    a. initiating an electric arc to said wire tip by subjecting it concurrently to an RF electric field and a DC electric field, and
    b. maintaining said arc by continuing to subject said wire tip to said RF electric field after removing said DC electric field.

2. The method of claim 1 characterized further in that said wire tip is subjected to said DC electric field prior to and during the initiation of said electric arc.

3. The method of claim 2 characterized further in that the DC electric field to which said wire tip is subjected is created by applying across a gap formed between said wire tip and an electrode spaced therefrom a DC voltage for a predetermined period of time (T1).

4. The method of claim 3 characterized further in that said RF electric field to which said wire tip is subjected is created by applying across said gap an RF voltage for a period of time (T2) which overlaps said predetermined time period T1.

5. The method of claim 4 characterized further in that the time period T2 during which said RF voltage is applied across said gap begins after and terminates after the beginning and the end, respectively, of the time period T1 during which said DC voltage is applied across said gap.

6. The method of claim 5 characterized further in that the time delay (T3) between the start of time periods T1 and T2 is sufficient to allow the DC voltage to reach substantially its predetermined final value prior to the application of said RF voltage.

7. The method of claim 6 characterized further in that the duration of time period T1 is sufficient to allow the DC current flowing across said gap to deliver sufficient energy at the prevailing DC current level to cause a ball to form at said wire tip.

8. The method of claim 7 characterized further in that the time lag between the ends of time periods T1 and T2 is sufficient to allow a plasma arc to form across said gap.

9. The method of claim 8 characterized further in that said time lag is short of that which would cause excessive annealing of said wire adjacent to said ball.

10. The method of claim 8 characterized further in that the duration of time period T1 is varied in order to adjust the size of the ball formed at said wire tip.

11. The method of claim 1 characterized further in that said electric arc is initiated and maintained by applying a pulse of RF energy across a gap formed between said wire tip and an electrode spaced therefrom.

12. The method of claim 11 characterized further in that prior to and during the initial phase of said pulse of RF energy a DC voltage is maintained across said gap.

13. The method of claim 1 characterized further in that said electric arc is initiated and said arc is maintained by subjecting said wire tip to a DC field for a period T1 and to an RF field for a period T2 trailing overlapping the period T1.

14. The method of claim 13 characterized further in that the time period T2 during which said wire tip is subjected to said RF field begins after and terminates after the beginning and the end, respectively, of the time period T1 during which said wire tip is subjected to said DC field.

15. The method of claim 1 characterized further in that said wire tip is subjected to said DC electric field for a predetermined period of time (T1) and to said RF electric field for a predetermined period of time (T2) which overlaps said time period T1.

16. The method of claim 15 characterized further in that said time period T2 begins after and terminates after the beginning and the end, respectively, of said time period T1.

17. The method of claim 16 characterized further in that said electric fields are created by applying across a gap formed between said wire tip and an electrode spaced therefrom a DC voltage and an RF voltage for said predetermined times T1 and T2, respectively.

18. Apparatus for forming a ball at the tip of a wire preparatory to joining said wire tip to another surface, comprising in combination:
   a. means for supporting said wire adjacent said surface,
   b. an electrode, and means for supporting said electrode next to the tip of said wire, and
   c. means for generating and applying across the gap between said wire tip and said electrode an RF voltage to initiate an arc across said gap and a DC voltage to establish conditions which are conducive to initiation of said arc and to form a ball at the tip of said wire, said generating and applying means turning off said DC voltage before terminating said RF voltage.

19. The apparatus of claim 18 characterized further in that said DC voltage is of sufficient magnitude to insure that said ball is formed and in that said DC voltage begins sufficiently before the start of the application of said RF voltage to enhance conditions for the initiation of said arc.

20. The apparatus of claim 19 characterized further in that said generating means includes:
   a. an RF pulse generator,
   b. a DC voltage pulse generator, and
   c. a tuned circuit connected to apply the outputs of both of said pulse generators across the gap between said wire and said electrode.

21. The apparatus of claim 20 characterized further in that said tuned circuit comprises a pair of branches connected in parallel across the gap between said wire and said electrode.

22. The apparatus of claim 21 characterized further in that each said branch includes a pair of series-connected reactive components jointed at a respective input node, and in that the outputs of said generators are individually connected to respective ones of said input nodes.

23. The apparatus of claim 22 characterized further in that the branch whose node receives the output of said RF pulse generator comprises a pair of series-connected capacitors, the capacitance of one of which is a multiple of the capacitance of the other.

24. The apparatus of claim 23 characterized further in that the branch whose node is connected to said DC pulse generator comprises an inductor connected in series with a capacitor whose reactive impedance is a fraction of the reactive impedance of said inductor.

25. The apparatus of claim 20 characterized further in that said tuned circuit is resonant at the frequency of the output of said RF generator.

26. The apparatus of claim 25 characterized further in that said RF pulse generator means for varying the frequency of said RF pulse within a predetermined range commensurate with normal variations in the resonant frequency of said tuned circuit.

27. The apparatus of claim 20 characterized further in that the output impedance of said tuned circuit is a multiple of its input impedance at said RF frequency and in that there is produced at the output of said tuned circuit an RF pulse whose voltage is a multiple of the voltage of the output of said RF pulse generator.

28. The apparatus of claim 27 characterized further in that said RF pulse generator comprises:
   a. an RF power amplifier connected to apply its output to an input of said tuned circuit,
   b. means for generating a variable frequency RF signal,
   c. means for producing a gating signal corresponding in length to the RF pulse to be applied to said wire, and
   d. means connected to the outputs of said RF and gating signal generators for gating said RF signal to the input of said power amplifier.

29. Apparatus for forming a ball at the tip of a wire preparatory to joining said wire tip to another surface, comprising in combination:
   a. means for supporting said wire adjacent said surface,
   b. an electrode, and means for supporting said electrode next to the tip of said wire,
   c. a tuned circuit comprising a pair of branches connected in parallel across the gap between said wire and said electrode, each branch including a pair of series-connected reactive components joined at a respective input node,
   d. an RF pulse generator having an output individually connected to one of said input nodes and generating an RF voltage to initiate an arc across said gap, and
   e. a DC voltage pulse generator having an output individually connected to the other of said input nodes and producing a DC voltage of sufficient magnitude to insure that said ball is formed and beginning sufficiently before the start of the application of said RF voltage to enhance conditions for the initiation of said arc.

30. The apparatus of claim 29 characterized further in that the branch whose node is connected to the output of said RF pulse generator comprises a pair of series-connected capacitors, the capacitance of one of which is a multiple of the capacitance of the other.

31. The apparatus of claim 30 characterized further in that the branch whose node is connected to said DC pulse generator comprises an inductor connected in series with a capacitor whose reactive impedance is a fraction of the reactive impedance of said inductor.

32. A method of forming a ball at the tip of a wire preparatory to joining said wire tip to another surface comprising the steps of:
 a. establishing an electric arc across the gap between said wire tip and an electrode spaced therefrom by applying first a DC potential and then both a DC potential and an RF potential between said wire and said electrode so as to initiate and maintaine said arc, and maintaining said RF potential beyond the end of said DC potential so as to maintain a plasma after termination of said DC potential, and
 b. resonating said arc by connecting a tuned circuit between said wire and said electrode.

* * * * *